(12) United States Patent
Jiang

(10) Patent No.: US 7,615,871 B2
(45) Date of Patent: Nov. 10, 2009

(54) METHOD AND APPARATUS FOR ATTACHING MICROELECTRONIC SUBSTRATES AND SUPPORT MEMBERS

(75) Inventor: Tongbi Jiang, Boise, ID (US)

(73) Assignee: Micron Technology, Inc., Boise, ID (US)

(*) Notice: Subject to any disclaimer, the term of this patent is extended or adjusted under 35 U.S.C. 154(b) by 178 days.

(21) Appl. No.: 11/480,755

(22) Filed: Jun. 30, 2006

(65) Prior Publication Data

US 2007/0018337 A1    Jan. 25, 2007

Related U.S. Application Data

(62) Division of application No. 10/116,645, filed on Apr. 4, 2002, now Pat. No. 7,109,588.

(51) Int. Cl.
  H01L 23/52 (2006.01)
  H01L 23/48 (2006.01)
  H01L 29/40 (2006.01)
  H01L 27/146 (2006.01)
  H01L 27/148 (2006.01)

(52) U.S. Cl. .................. 257/783; 257/782; 257/777; 257/784; 257/E27.137; 257/E27.144; 257/E27.161

(58) Field of Classification Search ......... 257/782–784, 257/777, E27.137, E27.144, E27.161
See application file for complete search history.

(56) References Cited

U.S. PATENT DOCUMENTS

| | | |
|---|---|---|
| 4,563,811 A | 1/1986 | Cranston |
| 5,128,831 A | 7/1992 | Fox, III et al. |
| 5,139,973 A | 8/1992 | Nagy et al. |
| 5,208,188 A | 5/1993 | Newman |
| 5,252,857 A | 10/1993 | Kane et al. |
| 5,422,435 A * | 6/1995 | Takiar et al. ........... 174/521 |

(Continued)

FOREIGN PATENT DOCUMENTS

JP    6-287273    10/1994

(Continued)

OTHER PUBLICATIONS

U.S. Appl. No. 11/480,771, filed Jun. 30, 2006, Jiang.

(Continued)

*Primary Examiner*—Luan C Thai
(74) *Attorney, Agent, or Firm*—Perkins Coie LLP

(57) ABSTRACT

A microelectronic package and method for forming such packages. In one embodiment, the package can be formed by providing a support member having a first surface, a second surface facing opposite the first surface, and a projection extending away from the first surface. A quantity of adhesive material can be applied to the projection to form an attachment structure, and the adhesive material can be connected to a microelectronic substrate with the attachment structure providing no electrically conductive link between the microelectronic substrate and the support member. The microelectronic substrate and the support member can then be electrically coupled, for example, with a wire bond. In one embodiment, the projection can be formed by disposing a first material on a support member while the first material is at least partially flowable, reducing the flowability of the first material, and disposing a second material (such as the adhesive) on the first material.

13 Claims, 5 Drawing Sheets

U.S. PATENT DOCUMENTS

| | | |
|---|---|---|
| 5,518,957 A | 5/1996 | Kim |
| 5,535,101 A | 7/1996 | Miles et al. |
| 5,593,927 A | 1/1997 | Farnworth et al. |
| 5,614,766 A | 3/1997 | Takasu et al. |
| 5,656,857 A | 8/1997 | Kishita |
| 5,677,566 A | 10/1997 | King et al. |
| 5,696,033 A | 12/1997 | Kinsman |
| 5,739,585 A | 4/1998 | Akram et al. |
| D394,844 S | 6/1998 | Farnworth et al. |
| D402,638 S | 12/1998 | Farnworth et al. |
| 5,851,845 A | 12/1998 | Wood et al. |
| 5,855,821 A | 1/1999 | Chau et al. |
| 5,866,953 A | 2/1999 | Akram et al. |
| 5,871,808 A | 2/1999 | Thompson, Sr. |
| 5,876,498 A | 3/1999 | Thompson, Sr. |
| 5,883,426 A | 3/1999 | Tokuno et al. |
| 5,891,753 A | 4/1999 | Akram |
| 5,893,726 A | 4/1999 | Farnworth et al. |
| 5,898,224 A | 4/1999 | Akram |
| 5,920,118 A | 7/1999 | Kong |
| 5,925,930 A | 7/1999 | Farnworth et al. |
| 5,933,713 A | 8/1999 | Farnworth |
| 5,938,956 A | 8/1999 | Hembree et al. |
| 5,946,553 A | 8/1999 | Wood et al. |
| 5,956,236 A | 9/1999 | Corisis et al. |
| 5,958,100 A | 9/1999 | Farnworth et al. |
| 5,986,209 A | 11/1999 | Tandy |
| 5,989,941 A | 11/1999 | Wensel |
| 5,990,566 A | 11/1999 | Farnworth et al. |
| 5,994,784 A | 11/1999 | Ahmad |
| RE36,469 E | 12/1999 | Wood et al. |
| 6,008,070 A | 12/1999 | Farnworth |
| 6,008,074 A | 12/1999 | Brand |
| 6,017,776 A | 1/2000 | Jiang et al. |
| 6,020,624 A | 2/2000 | Wood et al. |
| 6,020,629 A | 2/2000 | Farnworth et al. |
| 6,025,728 A | 2/2000 | Hembree et al. |
| 6,028,365 A | 2/2000 | Akram et al. |
| 6,046,496 A | 4/2000 | Corisis et al. |
| 6,048,744 A | 4/2000 | Corisis et al. |
| 6,048,755 A | 4/2000 | Jiang et al. |
| 6,049,125 A | 4/2000 | Brooks et al. |
| 6,051,878 A | 4/2000 | Akram et al. |
| 6,063,647 A | 5/2000 | Chen et al. |
| 6,072,233 A | 6/2000 | Corisis et al. |
| 6,072,236 A | 6/2000 | Akram et al. |
| 6,075,288 A | 6/2000 | Akram |
| 6,089,920 A | 7/2000 | Farnworth et al. |
| 6,097,087 A | 8/2000 | Farnworth et al. |
| 6,103,547 A | 8/2000 | Corisis et al. |
| 6,107,122 A | 8/2000 | Wood et al. |
| 6,107,680 A | 8/2000 | Hodges |
| 6,114,753 A | 9/2000 | Nagai et al. |
| 6,114,769 A | 9/2000 | Thompson, Sr. |
| 6,117,382 A | 9/2000 | Thummel |
| 6,118,176 A | 9/2000 | Tao et al. |
| 6,124,634 A | 9/2000 | Akram et al. |
| 6,133,066 A | 10/2000 | Murakami |
| 6,150,717 A | 11/2000 | Wood et al. |
| 6,153,924 A | 11/2000 | Kinsman |
| 6,159,764 A | 12/2000 | Kinsman et al. |
| 6,172,419 B1 | 1/2001 | Kinsman |
| 6,175,149 B1 | 1/2001 | Akram |
| 6,175,159 B1 | 1/2001 | Sasaki |
| 6,184,465 B1 | 2/2001 | Corisis |
| 6,194,250 B1 | 2/2001 | Melton et al. |
| 6,198,172 B1 | 3/2001 | King et al. |
| 6,208,519 B1 | 3/2001 | Jiang et al. |
| 6,210,992 B1 | 4/2001 | Tandy et al. |
| 6,212,767 B1 | 4/2001 | Tandy |
| 6,215,175 B1 | 4/2001 | Kinsman |
| 6,218,731 B1 | 4/2001 | Huang et al. |
| 6,225,689 B1 | 5/2001 | Moden et al. |
| 6,228,548 B1 | 5/2001 | King et al. |
| 6,229,202 B1 | 5/2001 | Corisis |
| 6,235,554 B1 | 5/2001 | Akram et al. |
| 6,246,108 B1 | 6/2001 | Corisis et al. |
| 6,252,308 B1 | 6/2001 | Akram et al. |
| 6,258,623 B1 | 7/2001 | Moden et al. |
| 6,258,624 B1 | 7/2001 | Corisis |
| 6,259,153 B1 | 7/2001 | Corisis |
| 6,261,865 B1 | 7/2001 | Akram |
| 6,265,763 B1 * | 7/2001 | Jao et al. .................... 257/676 |
| 6,271,058 B1 | 8/2001 | Yoshida |
| 6,277,671 B1 | 8/2001 | Tripard |
| 6,281,577 B1 | 8/2001 | Oppermann et al. |
| 6,284,571 B1 | 9/2001 | Corisis et al. |
| 6,291,894 B1 | 9/2001 | Farnworth et al. |
| 6,294,839 B1 | 9/2001 | Mess et al. |
| 6,297,547 B1 | 10/2001 | Akram |
| 6,303,981 B1 | 10/2001 | Moden |
| 6,303,985 B1 | 10/2001 | Larson et al. |
| 6,310,288 B1 | 10/2001 | Moden |
| 6,310,390 B1 | 10/2001 | Moden |
| 6,312,977 B1 | 11/2001 | Jiang et al. |
| 6,314,639 B1 | 11/2001 | Corisis |
| 6,316,285 B1 | 11/2001 | Jiang et al. |
| 6,316,727 B1 * | 11/2001 | Liu .......................... 174/557 |
| 6,316,838 B1 * | 11/2001 | Ozawa et al. ............... 257/778 |
| 6,326,242 B1 | 12/2001 | Brooks et al. |
| 6,326,244 B1 | 12/2001 | Brooks et al. |
| 6,326,687 B1 | 12/2001 | Corisis |
| 6,326,697 B1 | 12/2001 | Farnworth |
| 6,326,698 B1 | 12/2001 | Akram |
| 6,329,220 B1 | 12/2001 | Bolken et al. |
| 6,331,221 B1 | 12/2001 | Cobbley |
| 6,331,453 B1 | 12/2001 | Bolken et al. |
| 6,332,766 B1 | 12/2001 | Thummel |
| 6,333,564 B1 | 12/2001 | Katoh et al. |
| 6,342,728 B2 | 1/2002 | Miyazaki et al. |
| 6,365,434 B1 | 4/2002 | Rumsey et al. |
| 6,385,049 B1 | 5/2002 | Chia-Yu et al. |
| 6,396,129 B1 | 5/2002 | Hung et al. |
| 6,400,033 B1 | 6/2002 | Darveaux |
| 6,414,396 B1 * | 7/2002 | Shim et al. .................. 257/778 |
| 6,429,528 B1 | 8/2002 | King et al. |
| 6,437,446 B1 * | 8/2002 | Uchida ...................... 257/777 |
| 6,448,635 B1 | 9/2002 | Glenn |
| 6,451,709 B1 | 9/2002 | Hembree |
| 6,455,354 B1 | 9/2002 | Jiang |
| 6,479,323 B1 | 11/2002 | Lo et al. |
| 6,501,170 B1 | 12/2002 | Dickey et al. |
| 6,503,776 B2 * | 1/2003 | Pai et al. ..................... 438/106 |
| 6,528,408 B2 | 3/2003 | Kinsman |
| 6,528,722 B2 | 3/2003 | Huang et al. |
| 6,541,872 B1 | 4/2003 | Schrock et al. |
| 6,548,376 B2 | 4/2003 | Jiang |
| 6,548,757 B1 | 4/2003 | Russell et al. |
| 6,552,426 B2 * | 4/2003 | Ishio et al. .................. 257/692 |
| 6,552,910 B1 | 4/2003 | Moon et al. |
| 6,558,600 B1 | 5/2003 | Williams et al. |
| 6,560,117 B2 | 5/2003 | Moon |
| 6,561,479 B1 | 5/2003 | Eldridge |
| 6,564,979 B2 | 5/2003 | Savaria |
| 6,576,494 B1 | 6/2003 | Farnworth |
| 6,576,495 B1 | 6/2003 | Jiang et al. |
| 6,589,820 B1 | 7/2003 | Bolken |
| 6,592,783 B2 | 7/2003 | Kumakura et al. |
| 6,593,662 B1 * | 7/2003 | Pu et al. ..................... 257/777 |
| 6,607,937 B1 | 8/2003 | Corisis |
| 6,614,092 B2 | 9/2003 | Eldridge et al. |
| 6,622,380 B1 | 9/2003 | Grigg |
| 6,638,595 B2 | 10/2003 | Rumsey et al. |
| 6,644,949 B2 | 11/2003 | Rumsey et al. |

| | | |
|---|---|---|
| 6,653,173 B2 | 11/2003 | Bolken |
| 6,656,769 B2 | 12/2003 | Lee et al. |
| 6,661,104 B2 | 12/2003 | Jiang et al. |
| 6,664,139 B2 | 12/2003 | Bolken |
| 6,670,719 B2 | 12/2003 | Eldridge et al. |
| 6,672,325 B2 | 1/2004 | Eldridge |
| 6,673,649 B1 | 1/2004 | Hiatt et al. |
| 6,724,076 B1 | 4/2004 | Kahlisch et al. |
| 6,753,613 B2 * | 6/2004 | Levardo et al. ............. 257/780 |
| 6,770,164 B1 | 8/2004 | Schrock et al. |
| 6,781,849 B2 * | 8/2004 | Baek et al. ................... 361/760 |
| 6,836,002 B2 * | 12/2004 | Chikawa et al. ............. 257/666 |
| 6,838,754 B2 * | 1/2005 | Kim ........................... 257/666 |
| 6,841,858 B2 * | 1/2005 | Shim et al. .................. 257/676 |
| 6,844,618 B2 | 1/2005 | Jiang et al. |
| 6,885,093 B2 * | 4/2005 | Lo et al. ..................... 257/686 |
| 6,906,424 B2 | 6/2005 | Kinsman |
| 7,091,064 B2 | 8/2006 | Jiang |
| 7,109,588 B2 | 9/2006 | Jiang |
| 2002/0074645 A1 | 6/2002 | Dickey et al. |
| 2002/0160185 A1 | 10/2002 | Nagai et al. |
| 2003/0134451 A1 | 7/2003 | Chen |
| 2003/0189262 A1 | 10/2003 | Jiang |
| 2004/0067606 A1 | 4/2004 | Fehr et al. |
| 2004/0265549 A1 | 12/2004 | Kydd |
| 2005/0006743 A1 | 1/2005 | Kim et al. |
| 2005/0016751 A1 | 1/2005 | Jiang et al. |
| 2005/0230821 A1 | 10/2005 | Kheng |
| 2006/0177970 A1 | 8/2006 | Clyne et al. |
| 2006/0189036 A1 | 8/2006 | Clyne et al. |

FOREIGN PATENT DOCUMENTS

JP 07263382 10/1995

OTHER PUBLICATIONS

Peter, Robert, "Ultra-low Profile Chip Scale Package Challenges for 300mm Die Bonder," Business Briefing: Global Semiconductor Manufacturing Technology, Aug. 2003, pp. 1-5.

* cited by examiner

METHOD AND APPARATUS FOR ATTACHING MICROELECTRONIC SUBSTRATES AND SUPPORT MEMBERS

CROSS-REFERENCE TO RELATED APPLICATION

This application is a divisional of U.S. patent application Ser. No. 10/116,645, filed Apr. 4, 2002, which is incorporated herein by reference in its entirety.

BACKGROUND

Conventional microelectronic device packages typically include a microelectronic substrate or die attached to a support member, such as a printed circuit board. Bond pads or other terminals on the die are electrically connected to corresponding terminals of the support member, for example, with wire bonds. The die, the support member, and the wire bonds are then encapsulated with a protective epoxy material to form a device package. The package can then be electrically connected to other microelectronic devices or circuits, for example, in a consumer or industrial electronic product such as a computer.

In one existing arrangement shown in FIG. 1A, a microelectronic device package 10a includes a support member 20 having an aperture 21. A microelectronic substrate 30 is attached to the support member 20 with strips of adhesive tape 40a. Substrate bond pads 31 are then electrically connected to corresponding support member bond pads 22 with wire bonds 32 that extend through the aperture 21. An encapsulant 11, which includes a suspension of filler material particles 12, is disposed over the microelectronic substrate 30 and the wire bonds 32. The sizes of the filler material particles 12 in any given package 10a typically range in a standard distribution about a selected mean value.

One drawback with the foregoing arrangement is that the filler material particles 12 (and in particular, the largest filler material particles 12) can impinge on and damage the microelectronic substrate 30. Because the larger particles 12 tend to settle toward the support members 20, one approach to addressing the foregoing drawback is to increase the separation distance between the microelectronic substrate 30 and the support member 20 by increasing the thickness of the tape 40a. Accordingly, an advantage of the tape 40a is that it can be selected to have a thickness sufficient to provide the desired separation between the microelectronic substrate 30 and the support member 20. However, a drawback with the tape 40a is that it can be expensive to install. A further drawback is that the tape 40a can be difficult to accurately position between the support member 20 and the microelectronic substrate 30.

FIG. 1B illustrates another existing microelectronic device package 10b having a microelectronic substrate 30 attached to the support member 20 with screen printed strips of epoxy 40b. The epoxy 40b can be easier than the tape 40a (FIG. 1A) to dispense on the support member 20, but can have other problems. For example, the epoxy 40b can apply stresses to the sides of the microelectronic substrate 30, but it may be difficult to control how much of the sides the epoxy 40b contacts, making it difficult to control the stress applied to the microelectronic substrate 30. Another drawback is that the thickness of the epoxy 40b typically ranges from about 8 microns to about 25 microns, while in some cases the desired separation between microelectronic substrate 30 and the support member 20 is greater than about 75 microns, for example, to avoid the particle impingement problem described above. Still another drawback is that the interfaces between the epoxy 40b and the encapsulant 11 (one located to the outside of the microelectronic substrate 30 and the other located beneath the microelectronic substrate 30) can delaminate, which can reduce the integrity of the package 10b. The interface located beneath the microelectronic substrate 30 can also create a high stress region that can cause a crack C to form in the encapsulant 11. The crack C can damage the integrity of the wire bond 32.

Another problem with both the tape 40a and the epoxy 40b is that the coefficient of thermal expansion (CTE) of these components is typically substantially different than the CTE of other components of the package. For example, the microelectronic substrate 30 typically has a CTE of about 3 parts per million (ppm) per ° C., the support member 20 typically has a coefficient CTE of about 50 ppm/° C., and the encapsulant 11 typically has a CTE of from about 10-15 ppm/° C. By contrast, the tape 40a and the epoxy 40b each have a CTE of about 150-400 ppm/° C. Accordingly, both the tape 40a and the epoxy 40b can exert substantial shear and/or normal forces on the microelectronic substrate 30 during thermal excursions for curing, reflow and other processes. These forces can crack the microelectronic substrate 30, and/or delaminate layers from the microelectronic substrate 30 and/or the support member 20, causing the package to fail.

SUMMARY

The present invention is directed toward microelectronic packages and methods for forming such packages. A method in accordance with one aspect of the invention includes providing a support member having a first surface, a second surface facing opposite the first surface, and a projection extending away from the first surface. The method can further include forming an attachment structure by applying a quantity of adhesive material to the projection and connecting the adhesive material to the microelectronic substrate with a surface of the microelectronic substrate facing toward the first surface of the support member and with the attachment structure providing no electrically conductive link between the microelectronic substrate and the support member. The microelectronic substrate and the support member can then be electrically connected, for example, with a wire bond.

In one aspect of the invention, the projection can include an electrically conductive material, such as copper or aluminum. Alternatively, the projection can have the same composition as the adhesive material. In another aspect of the invention, the attachment structure can be formed by disposing a first quantity of material on at least one of the microelectronic substrate and the support member while the first quantity of material is at least partially flowable. The flowability of the first quantity of material can be at least partially reduced, and a second quantity of material can be applied to the attachment structure while the second quantity of material is at least partially flowable. The attachment structure can then be connected to the other of the microelectronic substrate and the support member.

In other aspects of the invention, the attachment structure can have a first bond strength at a joint with the support member, and a second bond strength at a joint with the microelectronic substrate, with the second bond strength greater than the first bond strength. The height of the attachment structure can be about 35 microns or more in one embodiment, and can exceed 75 microns in another embodiment. In still further aspects of the invention, the attachment structure can be connected between two microelectronic substrates.

DETAILED DESCRIPTION

The present disclosure describes microelectronic substrate packages and methods for forming such packages. The term "microelectronic substrate" is used throughout to include substrates upon which and/or in which microelectronic circuits or components, data storage elements or layers, and/or vias or conductive lines are or can be fabricated. Many specific details of certain embodiments of the invention are set forth in the following description and in FIGS. 2A-7 to provide a thorough understanding of these embodiments. One skilled in the art, however, will understand that the present invention may have additional embodiments, and that the invention may be practiced without several of the details described below.

Figure 2A:
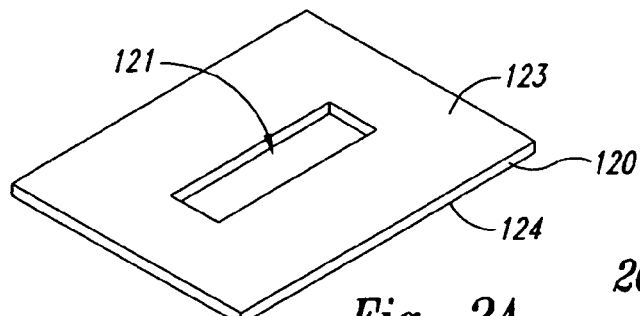
FIGS. 2A-2E illustrate a process for attaching a microelectronic substrate to a support member in accordance with an embodiment of the invention.

FIGS. 2A-2E illustrate a process for attaching a microelectronic substrate to a support member to form a microelectronic package in accordance with an embodiment of the invention. Referring first to FIG. 2A, the process can include providing a support member 120 (such as a printed circuit board) having a generally flat, planar shape with a first surface 123 and a second surface 124 facing opposite from the first surface 123. An aperture 121 can extend through the support member 120 from the first surface 123 to the second surface 124 to receive conductive couplers, as described in greater detail below with reference to FIG. 2E.

Figure 2B:
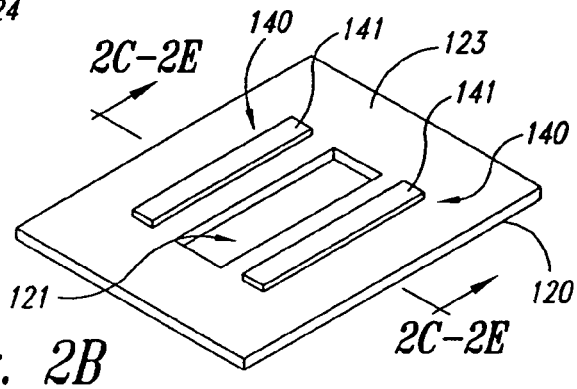

Referring now to FIG. 2B, one or more attachment structures 140 (two are shown in FIG. 2B) can be disposed on the support member 120. Each attachment structure 140 can include a projection 141 that extends away from the first surface 123. The projections 141 can be formed from any of a variety of materials in accordance with any of a variety of methods. For example, the projections 141 can include a conductive material, such as copper or aluminum, disposed on the support member 120 in a process such as a chemical vapor deposition, physical vapor deposition, or electrochemical deposition process. The projections 141 can then be shaped using conventional etching techniques. Alternatively, the projections 141 can include nonconductive materials, such as a solder mask material, an epoxy material, or an adhesive strip (e.g., a tape material). In one embodiment, the projections 141 can include a flowable die attach material, as described in greater detail below with reference to FIGS. 3A-3E. In another embodiment, the projections 141 can be formed integrally with the support member 120, for example during the initial manufacture of the support member 120. In any of these embodiments, the projections 141 can be positioned to support a microelectronic substrate relative to the support member 120.

Figure 2C:
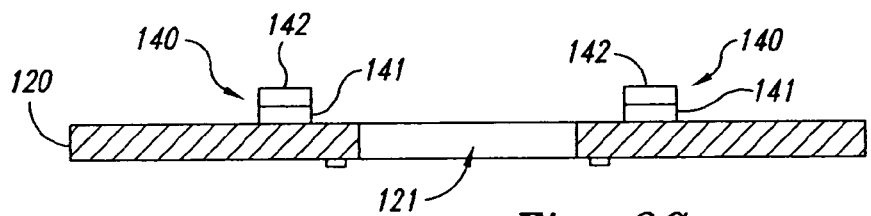

FIG. 2C is a cross-sectional view of the support member 120 shown in FIG. 2B, with adhesive material portions 142 disposed on each of the projections 141. The adhesive materials portions 142 can include a conventional die attach material, such as QMI 536, available from Dexter Electronic Materials, a business of Loktite Corporation of Rocky Hills, Conn., or 2025D, available from Ablestik of Rancho Dominguez, Calif. In other embodiments, the adhesive material portions 142 can include other materials. For example, the adhesive material portions 142 can include adhesive tape strips, such as double-backed tape strips. In any of these embodiments, the adhesive material portions 142 can be selected to adhere to both the projection 141 and a microelectronic substrate, as described in greater detail below with reference to FIG. 2D.

Figure 2D:
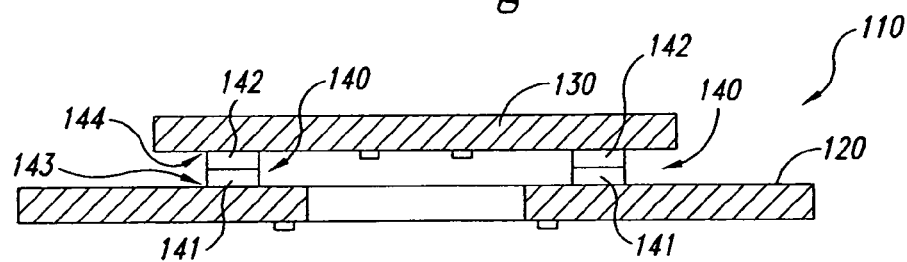

Referring now to FIG. 2D, a microelectronic substrate 130 can be connected to and/or carried by the attachment structures 140 by contacting the microelectronic substrate 130 with the adhesive material portions 142 to form a microelectronic package 110. Accordingly, the attachment structures 140 can include a first joint 143 at the interface with the support member 120, and a second joint 144 at the interface with the microelectronic substrate 130. In some embodiments, the first joint 143 and the second joint 144 can be selected to have different strengths. For example, if the support member 120, the microelectronic substrate 130, and/or the attachment structure 140 have unequal coefficients of thermal expansion (CTEs), and this mismatch is large enough to cause the connection between the support member 120 and the microelectronic substrate 130 to fail, it may be desirable to have the failure occur at the first joint 143 (where the attachment structure 140 joins the support member 120) rather than at the second joint 144 (where the attachment structure 140 joins the microelectronic substrate 130). In particular, if the attachment structure 140 can cause damage to the component from which it separates, it may be desirable to confine such damage to the support member 120 rather than allow the microelectronic substrate 130 to be damaged. In one embodiment for which the strength of the first joint 143 is lower than the strength of the second joint 144, the projections 141 can include the QMI 536 material referred to above, and the adhesive material portions 142 can include 2025D die attach adhesive. In other embodiments, other materials can be selected for the projections 141 and the adhesive material portions 142. In any of these embodiments, the adhesive material portions 142 can include a material that is at least initially flowable and is disposed in its flowable state on the projection 141.

In one aspect of an embodiment shown in FIG. 2D, portions of the attachment structures 140 can include electrically conductive materials, but the attachment structures 140 do not provide a conductive link between the support member 120 and the microelectronic substrate 130. For example, the projections 141 can include an electrically conductive material while the adhesive material 142 includes an insulative material. In other embodiments, other portions of the attachment structures 140 (such as the projections 141) can be insulative so that the attachment structures 140 do not provide a conductive link between the support member 120 and the microelectronic substrate 130. Instead, electrical communication between these components can be provided by separate conductive couplers, as described below with reference to FIG. 2E.

Figure 2E:
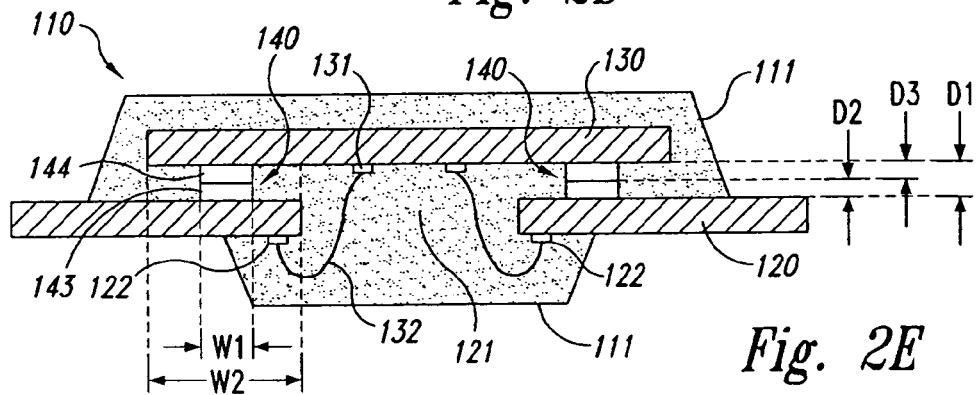

As shown in FIG. 2E, the microelectronic substrate 130 can be electrically connected to the support member 120 with conductive couplers 132, such as wire bonds. For example, the conductive couplers 132 can extend between substrate bond pads 131 positioned on the lower surface of the microelectronic substrate 130, and support member bond pads 122 positioned on the second surface 124 of the support member 120. Accordingly, the conductive couplers 132 can extend through the aperture 121 of the support member 120. An encapsulant 111 can then be disposed over the microelectronic substrate 130 and at least a portion of the support member 120 to protect the physical and electrical connections between the microelectronic substrate 130 and the support member 120. Alternatively, the encapsulant 111 can be eliminated. For example, the microelectronic substrate 130 and the associated electrical connections can be protected with a hollow cap disposed over the support member 120.

In another aspect of an embodiment shown in FIG. 2E, a distance D1 between the microelectronic substrate 130 and the support member 120 (i.e., the height of the attachment structure 140) can be selected to enhance the performance of the package 110. For example, in one embodiment, the distance D1 can be selected to be greater than 25 microns (the distance conventionally achievable with an epoxy bond) and, in a further aspect of this embodiment, the distance D1 can be selected to be 35 microns or greater. In still a further aspect of this embodiment, the distance D1 can be selected to be about 75 microns, or 100 microns, or greater to reduce the likelihood for filler material disposed in the encapsulant 111 to impinge on and damage the microelectronic substrate 130.

In another aspect of an embodiment shown in FIG. 2E, a distance D2 (by which the projection 141 extends above the support member 120), and a distance D3 (by which the adhesive material volume 142 extends above the projection 141) can be selected in a variety of manners to achieve the overall separation distance D1 described above. For example, D2 can be relatively large and D3 relatively small to reduce the volume occupied by the adhesive material 142. In other embodiments, the relative values of D2 and D3 can be reversed. In one embodiment in which the projection 141 is formed from an initially flowable material such as epoxy, the distance D2 can have a value of from about 8 microns to about 25 microns.

In yet another aspect of an embodiment described above with reference to FIG. 2E, the lateral extent of the attachment structures 140 can be selected to enhance the performance of the package 110. For example, the attachment structures 140 can be positioned only beneath the microelectronic substrate 130, rather than extending around the sides of the microelectronic substrate 130 as typically occurs with some conventional epoxy bonds. An advantage of this arrangement, when compared to some conventional epoxy bonds is that attachment structures 140 can be less likely to impose damaging stresses on the microelectronic substrate 130.

Figure 1A:
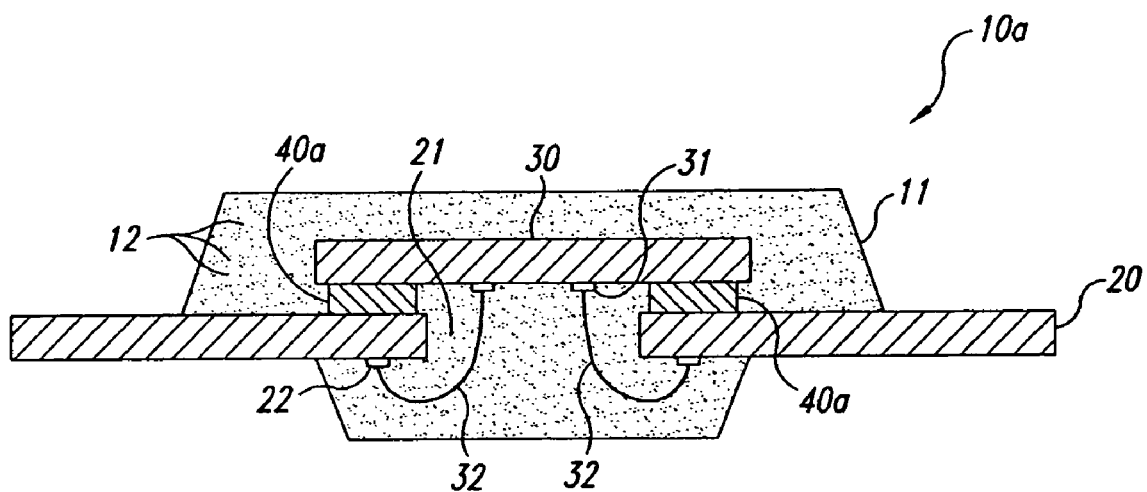
FIG. 1A is a cross-sectional view of a microelectronic device package having a tape adhesive in accordance with the prior art.
Figure 1B:
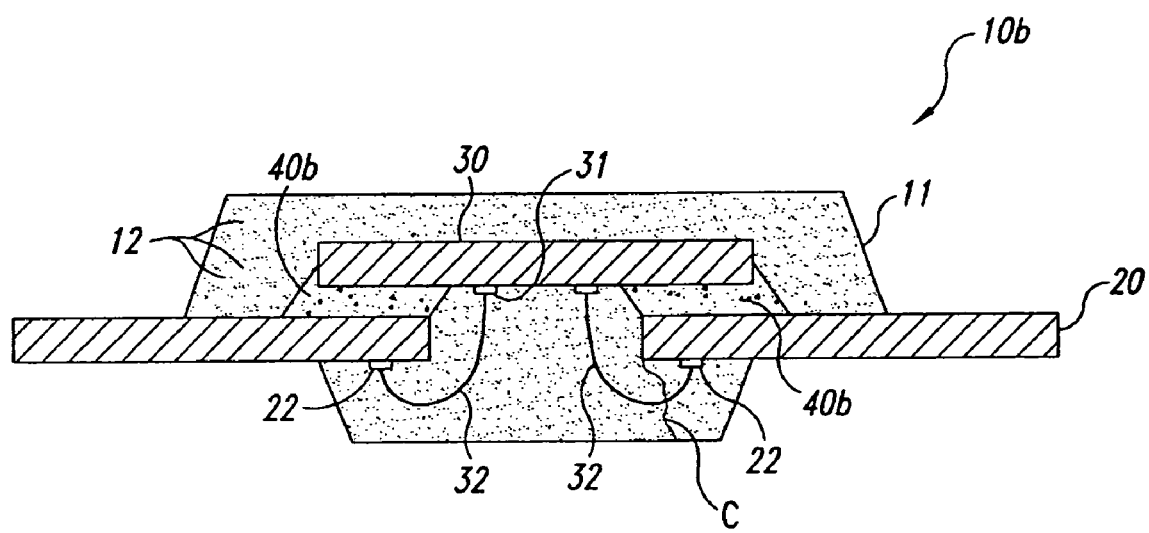
FIG. 1B is a cross-sectional view of a microelectronic device package having an epoxy adhesive in accordance with the prior art.

In a further aspect of this embodiment, a lateral extent W1 of the attachment structure 140 can be significantly less than a lateral extent W2 of the region of the microelectronic substrate 130 that overlaps the support member 120. For example, in one embodiment, W1 can have a value of from about ⅓ to about ½ of the value of W2. A feature of this arrangement is that the volume of the attachment structure 140 can be reduced relative to the overall volume of the encapsulant 111. An advantage of this arrangement is that it can reduce or eliminate damage caused by CTE mismatch. For example, the encapsulant 111 may have a CTE that is more closely matched to that of the microelectronic substrate 130 and/or the support member 120, while the attachment structure 140 may have a CTE quite different from that of the microelectronic substrate 130 and/or the support member 120. Accordingly, by controlling the lateral extent W1 of the attachment structures 140, the fraction of the volume between the support member 120 and the microelectronic substrate 130 occupied by the attachment structure 140 can be reduced compared with some conventional arrangements. As a result, the attachment structure 140 can be less likely to fail or cause the microelectronic substrate 130 to fail when the package 110 undergoes thermal excursions. Another feature of this arrangement is that the attachment structure 140 can be recessed outwardly from the edge of the aperture 121. An advantage of this feature is that the potential high stress at the interface between the attachment structure 140 and the encapsulant 111 can be shifted outwardly and can be less likely than existing arrangements (such as that described above with reference to FIG. 1B) to crack the encapsulant 111.

Figure 3A:
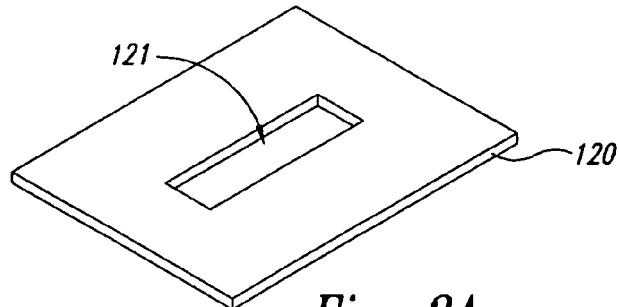
FIGS. 3A-3E illustrate an in-line process for attaching a microelectronic substrate to a support member in accordance with another embodiment of the invention.
Figure 3B:
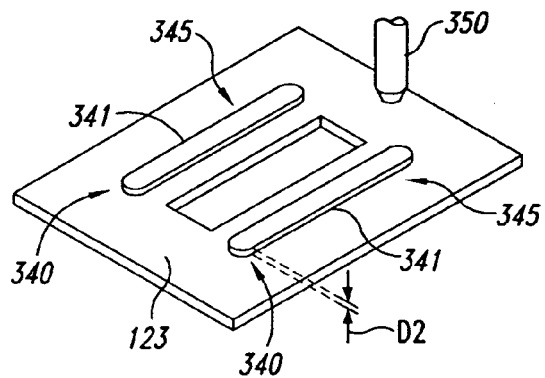

FIGS. 3A-3E schematically illustrate a process for forming a microelectronic package 110 generally similar to that described above with reference to FIGS. 2A-2E. In one aspect of this embodiment, the process can be performed by in-line die attach tools, such as are available from Datacon of Radfeld/Tyrole, Austria, or ESEC of Cham, Switzerland. In other embodiments, the process can be performed by other tools Referring first to FIG. 3A, the process can include providing a support member 120 having an aperture 121. As shown in FIG. 3B, the support member 120 can be positioned beneath a dispense nozzle 350. The dispense nozzle 350 can dispose two quantities of a first material 345 onto the support member 120, while the first material 345 is in a flowable state, to form two projections 341 extending away from the first surface 123 of the support member 120. The projections 341 can define, at least in part, corresponding attachment structures 340. In one embodiment, the dispense nozzle 350 can dispense a conventional die-attach material, such as QMI 536 or 2025D, described above. In other embodiments, the dispense nozzle 350 can dispose other initially flowable materials. In any of these embodiments, the amount of the first material 345 dispensed on the support member 120 and the distance D2 by which the resulting projections 341 extend beyond the first surface 123 can be low enough that the projections 341 maintain their shape without collapsing or slumping. For example, the projections 341 can have a height of from about 8 microns to about 25 microns in one embodiment.

Figure 3C:
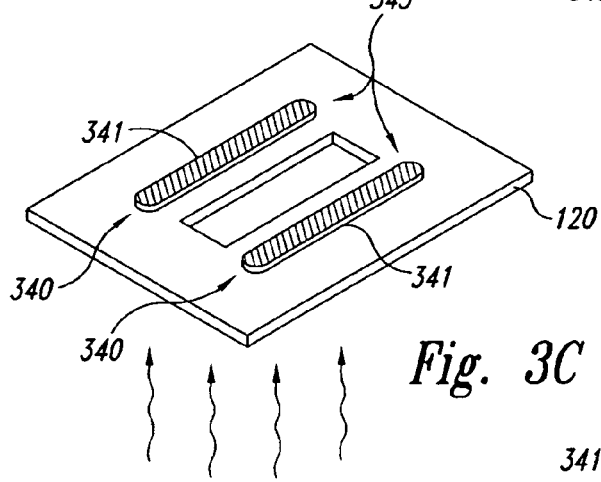

As shown in FIG. 3C, the flowability of the first material 345 can be reduced or eliminated after it has been dispensed on the support member 120, for example, by applying heat to the first material 345. In one aspect of this embodiment, the first material 345 can be a thermoset material and can be partially cured (e.g., to B-stage) or fully cured. In a specific aspect of this embodiment, the first material 345 can be "snap cured", for example by exposure to elevated temperatures from about 150° C. to about 200° C. for a period of three seconds or less. In other embodiments, the first material 345 can be exposed to other temperatures and/or can be exposed for other time periods, for example, time periods of up to about ten seconds. In still further embodiments, the flowability of the first material 345 can be reduced by other methods, for example, by cooling. In any of these embodiments, by at least reducing the flowability of the first material 345, the material 345 will tend to retain its shape and height and can more stably and securely support a second material, as described in greater detail below with reference to FIG. 3D.

Figure 3D:
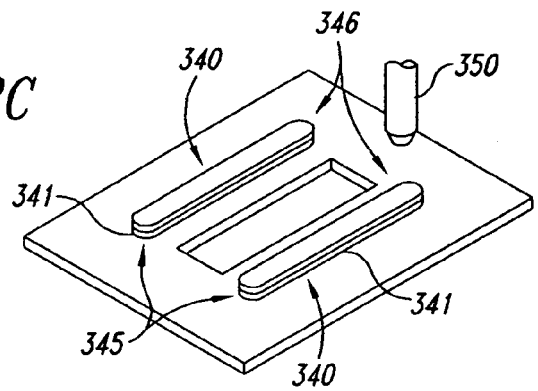

Referring now to FIG. 3D, a second material 346 can be disposed on each of the projections 341 while the second material 346 is in a flowable state to increase the height of the corresponding attachment structures 340. In one embodiment, the second material 346 can have a composition identical to that of the first material 345. Alternatively, the second material 346 can have a different composition than that of the first material 345. In either embodiment, the second material 346 can be dispensed on the projections 341 by the same dispense nozzle 350 that dispensed the first material 345, or by a different dispense nozzle. In any of these embodiments, the second material 346 can have adhesive properties, so as to adhere to the first material 345 and to the microelectronic substrate 130, as described below with reference to FIG. 3E.

Figure 3E:
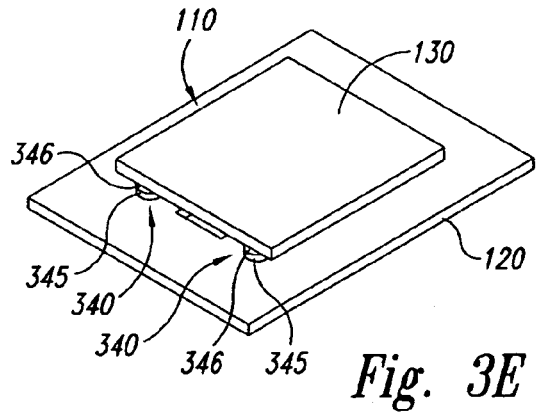
Figure 4:
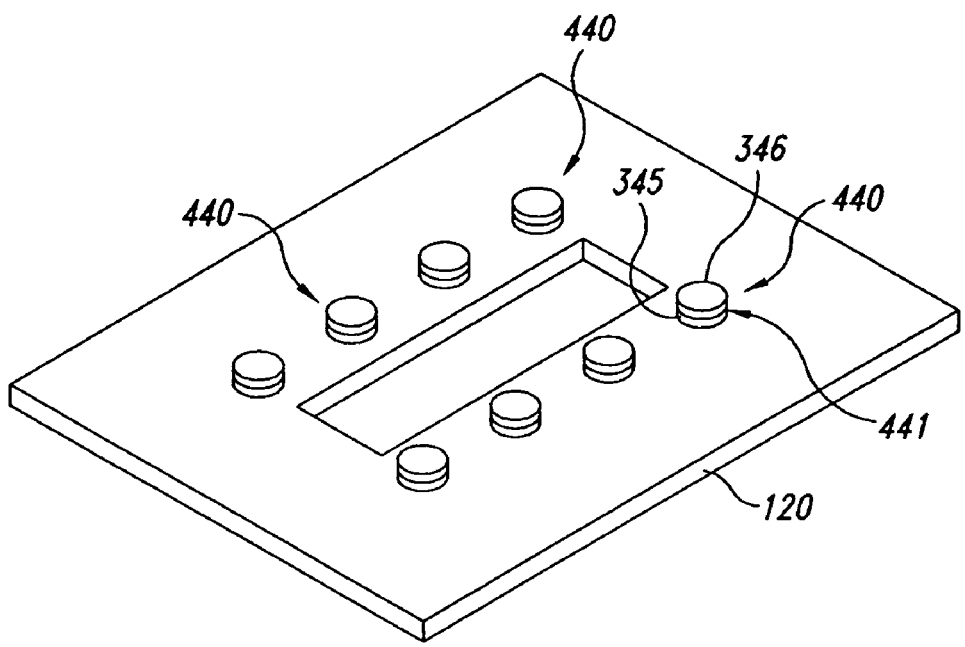
FIG. 4 is a partially schematic isometric view of a support member having attachment structures in accordance with another embodiment of the invention.

Referring now to FIG. 3E, the microelectronic substrate 130 can be attached to the second material 346 of the attachment structures 340. The resulting package 110 can then be encapsulated after the microelectronic substrate 130 is electrically coupled to the support member 120. Accordingly, the foregoing process can include sequentially disposing first and second flowable materials to build up attachment structures having heights, widths, and bond strengths generally similar to those described above with reference to FIGS. 2A-2E. The in-line arrangement of this process can result in an efficient and effective package formation procedure.

In other embodiments, the attachment structures and packages described above with reference to FIGS. 2A-3E can have other arrangements. For example, referring to FIG. 4, the support member 120 can include a plurality of attachment structures 440 that are arranged in discrete columns rather than continuous strips. Each attachment structure 440 can include a projection 441 formed, for example, from the first material 345. Alternatively, the projections 441 can include non-flowable materials. Each attachment structure 440 can further include a second material 346 disposed on the projection 441. The second material 346 can be applied in a manner generally similar to any of those described above with reference to FIGS. 2A-3E. In one aspect of this embodiment, the attachment structures 440 can have a generally circular cross-sectional shape and in other embodiments, the attachment structure 440 can have other shapes. In one embodiment, the attachment structures 440 can be arranged in rows, and in other embodiments the attachment structures 440 can be arranged in other patterns or arrays. In any of these embodiments, the attachment structures 440 can be connected to a corresponding microelectronic substrate 130 (not shown in FIG. 4) in a manner generally similar to that described above.

Figure 5:
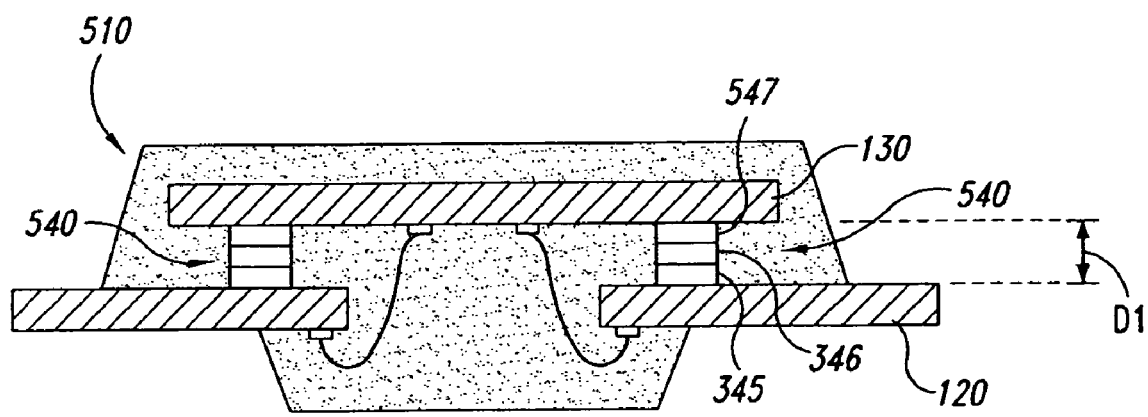
FIG. 5 is a cross-sectional view of a microelectronic package having attachment structures in accordance with still another embodiment of the invention.

FIG. 5 is a cross-sectional view of a package 510 having the microelectronic substrate 130 connected to the support member 120 with attachment structures 540 in accordance with another embodiment of the invention. In one aspect of this embodiment, each attachment structure 540 can include the first material 345, the second material 346 and a third material 547. In one aspect of this embodiment, the flowability of the first material 345 can be reduced before applying the second material 346, and the flowability of the second material 346 can be reduced before applying the third material 547. Alternatively, the first material 345 can be replaced with a conductive or a nonconductive material disposed by processes generally similar to those described above with reference to FIG. 2B. In still further embodiments, the attachment structures 540 can include more than three sequentially disposed quantities of material to achieve the desired separation distance D1 and/or other characteristics.

Figure 6:
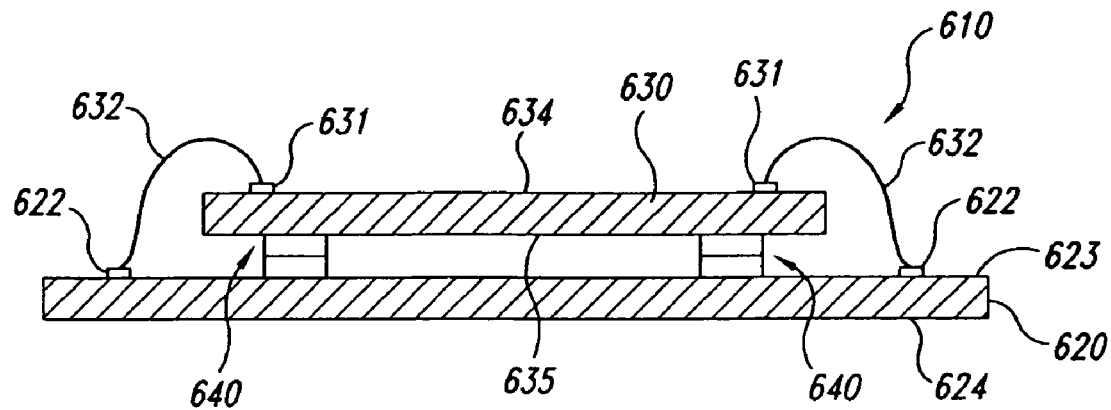
FIG. 6 is a cross-sectional view of a microelectronic substrate mounted to a support member to form a package in accordance with another embodiment of the invention.

FIG. 6 illustrates a package 610 having a microelectronic substrate 630 supported on a support member 620 in accordance with another embodiment of the invention. In one aspect of this embodiment, the microelectronic substrate 630 can be attached to the support member 620 with attachment structures 640 having characteristics generally similar to any of those described above with reference to FIGS. 2A-5. In a further aspect of this embodiment, the package 610 can have a "chip on board" configuration. Accordingly, the support member 620 can have a first surface 623 and a second surface 624 facing opposite from the first surface 623. The microelectronic substrate 630 can have a first surface 634 and a second surface 635 facing opposite the first surface 634 and facing toward the first surface 623 of the support member 620. The first surface 634 of the microelectronic substrate 630 can include substrate bond pads 631 which are connected with conductive couplers 632 (such as wire bonds) to corresponding support member bond pads 622 positioned on the first surface 623 of the support member 620. The physical and electrical connections between the microelectronic substrate 630 and the support member 620 can be protected, for example, with an encapsulant, a shell, or a cap.

Figure 7:
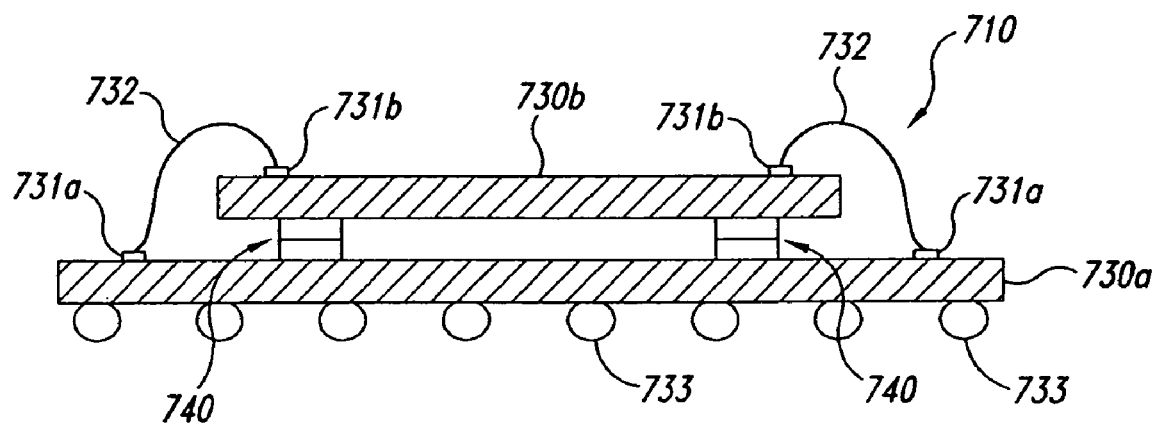
FIG. 7 is a cross-sectional view of two microelectronic substrates attached to each other with attachment structures in accordance with another embodiment of the invention.

FIG. 7 illustrates a microelectronic package 710 having a plurality of microelectronic substrates connected to each other in accordance with another embodiment of the invention. In one aspect of this embodiment, the package 710 can include a first microelectronic substrate 730a having first bond pads 731a. A second microelectronic substrate 730b can be attached to the first microelectronic substrate 730a with attachment structures 740 having configurations generally similar to any of those described above with reference to FIGS. 2A-5. The second microelectronic substrate 730b can include second bond pads 731b connected to the first bond pads 731a of the first microelectronic substrate 730a with conductive couplers 732, such as wire bonds. Solder balls 733 or other conductive devices can provide for electrical communication to and from the package 710.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. A microelectronic package, comprising:
    a first microelectronic substrate having a first active surface and a first back surface opposite the first active surface, the first microelectronic substrate carrying a first bond site at the first active surface;
    a second microelectronic substrate positioned at least proximate to the first microelectronic substrate, the second microelectronic substrate having a second active surface and a second back surface opposite the second active surface and facing the first active surface of the first microelectronic substrate, the second microelectronic substrate carrying a second bond site at the second active surface;
    a plurality of attachment structures connected directly between the first active surface of the first microelectronic substrate and the second back surface of the second microelectronic substrate, the attachment structures individually having a first quantity of material disposed on the first active surface of the first microelectronic substrate and a second quantity of material in direct contact with the first quantity of material and the second back surface of the second microelectronic substrate, the attachment structures forming no electrically conductive link between the first and second microelectronic substrates and being offset inwardly from a proximate edge of the second microelectronic substrate, wherein the attachment structures are laterally spaced apart from one another; and a wirebond connected directly between the first and second bond sites of the first and second microelectronic substrates.

2. The package of claim 1 wherein the first quantity of material is at least partially cured before the second quantity of material is disposed on the first quantity of material.

3. The package of claim 1 wherein the first quantity of material has a thickness of from about 8 microns to about 25 microns.

4. The package of claim 1 wherein the attachment structure is one of a plurality of attachment structures.

5. The package of claim 1 wherein at least one of the first and second quantities of material includes an epoxy.

6. The package of claim 1 wherein at least one of the first and second quantities of material includes an electrically conductive material.

7. The package of claim 1 wherein at least one of the first and second quantities of material includes a solder mask material.

8. The package of claim 1 wherein the first quantity of material has a first composition and the second quantity of material has a second composition different than the first composition.

9. The package of claim 1 wherein the first quantity of material has a first composition and the second quantity of material has a second composition at least generally similar to the first composition.

10. The package of claim 1 wherein the first quantity of material and the second quantity of material have at least approximately the same composition and form a generally homogeneous attachment structure between the first and second microelectronic substrates.

11. The package of claim 1 wherein the first quantity of material includes a projection extending from the first microelectronic substrate, and wherein the second quantity of material includes an adhesive disposed on the projection.

12. The package of claim 1 wherein the first quantity of material includes an epoxy.

13. The package of claim 1 wherein the second quantity of material includes an epoxy.

* * * * *

UNITED STATES PATENT AND TRADEMARK OFFICE
CERTIFICATE OF CORRECTION

PATENT NO. : 7,615,871 B2  Page 1 of 1
APPLICATION NO. : 11/480755
DATED : November 10, 2009
INVENTOR(S) : Tongbi Jiang It is certified that error appears in the above-identified patent and that said Letters Patent is hereby corrected as shown below:

In column 1, line 9, after "2002," insert -- now U.S. Pat. No. 7,109,588 --.

Signed and Sealed this

Nineteenth Day of January, 2010

David J. Kappos
*Director of the United States Patent and Trademark Office*